United States Patent
Huang et al.

(10) Patent No.: US 11,737,207 B2
(45) Date of Patent: Aug. 22, 2023

(54) PCB RF NOISE GROUNDING FOR SHIELDED HIGH-SPEED INTERFACE CABLE

(71) Applicant: Marvell Asia Pte, Ltd., Singapore (SG)

(72) Inventors: Shaowu Huang, Sunnyvale, CA (US); Dance Wu, Palo Alto, CA (US)

(73) Assignee: Marvell Asia Pte, Ltd., Singapore (SG)

(*) Notice: Subject to any disclaimer, the term of this patent is extended or adjusted under 35 U.S.C. 154(b) by 278 days.

(21) Appl. No.: 17/249,560

(22) Filed: Mar. 5, 2021

(65) Prior Publication Data
US 2021/0282260 A1    Sep. 9, 2021

Related U.S. Application Data

(60) Provisional application No. 62/987,241, filed on Mar. 9, 2020.

(51) Int. Cl.
*H05K 1/02*    (2006.01)
*H05K 1/18*    (2006.01)
(Continued)

(52) U.S. Cl.
CPC ........... *H05K 1/0225* (2013.01); *B60R 16/03* (2013.01); *H05K 1/18* (2013.01); *H05K 9/0064* (2013.01);
(Continued)

(58) Field of Classification Search
CPC ...... H05K 1/0225; H05K 1/18; H05K 9/0064; H05K 2201/0715; H05K 2201/0723;
(Continued)

(56) References Cited

U.S. PATENT DOCUMENTS 4,697,858 A    10/1987   Balakrishnan
4,904,968 A *  2/1990   Theus .................. H05K 1/0218
                                                     174/250
(Continued)

FOREIGN PATENT DOCUMENTS

EP    3806588    4/2021
WO    WO 2013/085071    6/2013

OTHER PUBLICATIONS

Olivieri et al., "A Removable EBG-Based Common Mode Filter for PCIE-Oriented High-Speed Buses" XP55807985, Jan. 1, 2018, retrieved from caelynx.com/wp-content/uploads/2019/07/r-ebg-based-filter.pdf.

*Primary Examiner* — Steven T Sawyer

(57) ABSTRACT

A printed circuit board (PCB) includes a substrate defining a major plane. A first side of the major plane is configured for mounting of functional circuit elements. A cable connector is mounted on a second side of the major plane of the substrate, opposite the first side, for coupling to a shielded radiofrequency (RF) communications cable. At least one component grounding layer is parallel to the major plane and configured for coupling to the functional elements. At least one cable grounding layer is parallel to the major plane and is separated from the at least one component grounding layer. Each cable grounding layer in the at least one cable grounding layer is coextensive with the substrate and is configured for coupling, through the connector, to shielding of the shielded RF communications cable, without coupling to any other component. Nodes of an RF communications system may be mounted on such PCBs.

21 Claims, 7 Drawing Sheets

(51) Int. Cl.
*H05K 9/00* (2006.01)
*B60R 16/03* (2006.01)
*H01R 12/75* (2011.01)

(52) U.S. Cl.
CPC .......... *H01R 12/75* (2013.01); *H01R 2201/04* (2013.01); *H01R 2201/26* (2013.01); *H05K 2201/0715* (2013.01); *H05K 2201/0723* (2013.01); *H05K 2201/10189* (2013.01)

(58) Field of Classification Search
CPC .......... H05K 2201/10189; H05K 2201/09236; H05K 2201/09327; H05K 2201/09663; H05K 2201/09754; H05K 2201/10356; H05K 1/0227; H05K 1/0219; H05K 2201/09336; H05K 1/0216; H05K 1/14; H05K 1/147; H05K 1/0215; H05K 2201/058; B60R 16/03; H01R 12/75; H01R 2201/04; H01R 2201/26; H01R 12/594; H01R 12/79; H01R 12/87; H01R 43/205

See application file for complete search history.

(56) References Cited

U.S. PATENT DOCUMENTS

| | | | |
|---|---|---|---|
| 5,208,561 A | 5/1993 | Delestre et al. | |
| 6,541,711 B1* | 4/2003 | Dube | H05K 1/0219 |
| | | | 174/255 |
| 2005/0095410 A1 | 5/2005 | Mazurkiewicz | |
| 2008/0284545 A1* | 11/2008 | Keefe | H01P 3/085 |
| | | | 333/204 |
| 2009/0058731 A1* | 3/2009 | Geary | H01Q 5/378 |
| | | | 343/700 MS |
| 2013/0196539 A1 | 8/2013 | Shafer et al. | |
| 2015/0282298 A1 | 10/2015 | Atkinson et al. | |
| 2016/0302301 A1 | 10/2016 | Kim et al. | |
| 2017/0179653 A1* | 6/2017 | Cho | H01R 24/50 |
| 2017/0311449 A1 | 10/2017 | Ohsawa | |
| 2019/0081376 A1* | 3/2019 | Takeda | H01P 3/14 |
| 2019/0214774 A1* | 7/2019 | Ishikawa | H01B 11/12 |
| 2021/0274645 A1* | 9/2021 | Hong | H05K 1/0215 |

* cited by examiner

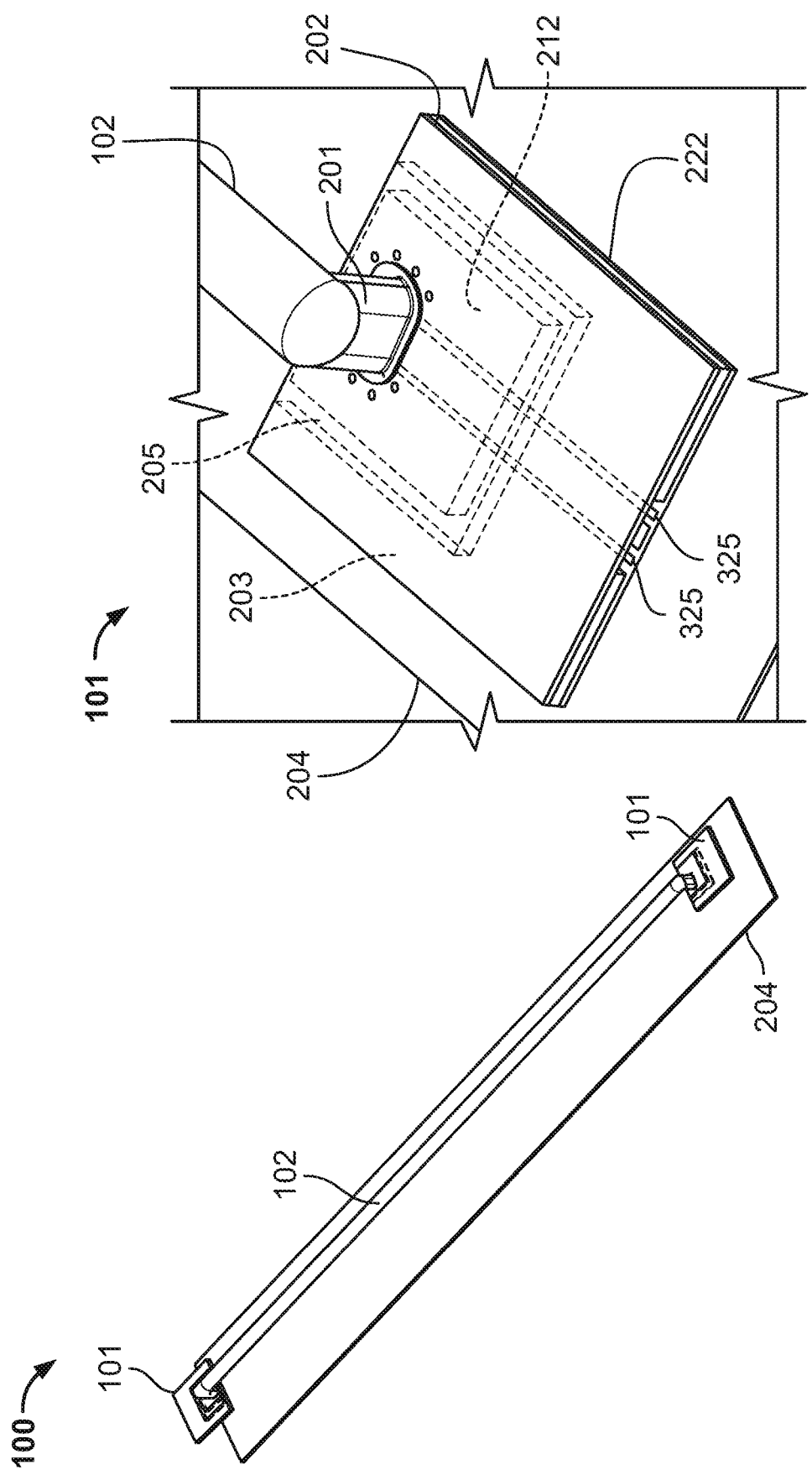

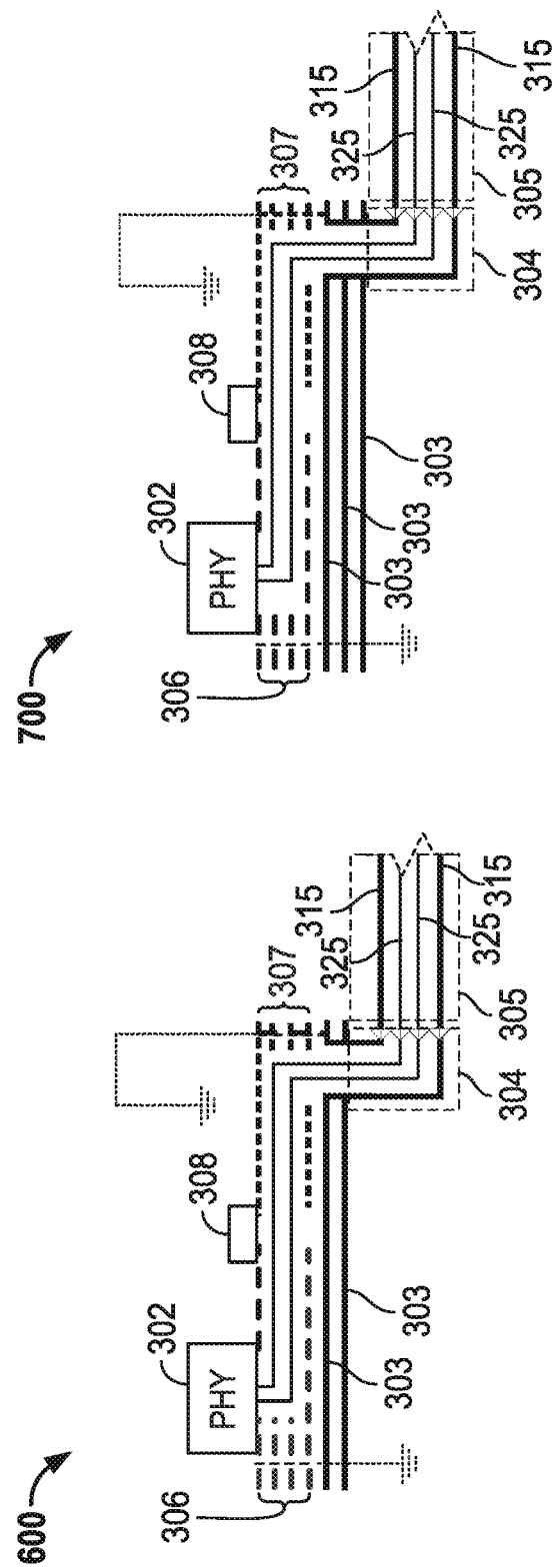

PCB RF NOISE GROUNDING FOR SHIELDED HIGH-SPEED INTERFACE CABLE

CROSS REFERENCE TO RELATED APPLICATION

This disclosure claims the benefit of commonly-assigned U.S. Provisional Patent Application No. 62/987,241, filed Mar. 9, 2020, which is hereby incorporated by reference herein in its entirety.

FIELD OF USE

This disclosure relates to radiofrequency (RF) noise grounding for a shielded network cable in a high-speed interface, such as a shielded network cable. More particularly, this disclosure relates to RF noise grounding for a shielded network cable coupled to a printed circuit board.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Wireline communication links for some high-speed interfaces, particularly for networking applications, operate under various standards that include strict electromagnetic compatibility requirements incorporating cable shielding specifications. However, in many situations, it is difficult to divert RF noise currents in cable shielding through connectors to ground.

SUMMARY

A printed circuit board in accordance with implementations of the subject matter of this disclosure includes a substrate defining a major plane, a first side of the major plane of the substrate configured for mounting thereon of functional circuit elements, a cable connector mounted on a second side of the major plane of the substrate, opposite the first side, for coupling to a shielded radiofrequency (RF) communications cable, at least one component grounding layer parallel to the major plane configured for coupling to the functional elements, and at least one cable grounding layer parallel to the major plane and separated from the at least one component grounding layer. Each cable grounding layer in the at least one cable grounding layer is coextensive with the substrate and is configured for coupling, through the connector, to shielding of the shielded RF communications cable, without coupling to any other component.

In a first implementation of such a printed circuit board, the at least one cable grounding layer may include a plurality of cable grounding layers, each cable grounding layer in the plurality of cable grounding layers being separated from each other cable grounding layer in the plurality of cable grounding layers.

A second implementation of such a printed circuit board may further include at least one additional component grounding layer. Each respective one of the at least one additional component grounding layer may be coextensive with the substrate and may be tightly wirelessly coupled to a respective one of the at least one cable grounding layer.

A wireline radiofrequency (RF) communications system in accordance with implementations of the subject matter of this disclosure includes a plurality of nodes, at least one node in the plurality of nodes including at least one functional circuit component, and a printed circuit board having a substrate defining a major plane. The at least one functional circuit component is mounted on a first side of the major plane of the substrate. The printed circuit board further includes a cable connector mounted on a second side of the major plane of the substrate, opposite the first side, at least one component grounding layer parallel to the major plane and coupled to the at least one functional component, and at least one cable grounding layer parallel to the major plane and separated from the at least one component grounding layer, each cable grounding layer in the at least one cable grounding layer being coextensive with the substrate. A shielded RF cable is coupled to the cable connector for coupling the at least one node to another node in the plurality of nodes, and has shielding that is conductively coupled, through the connector, to the at least one cable grounding layer, each cable grounding layer in the at least one cable grounding layer being without coupling to any other component.

In a first implementation of such a wireline RF communications system, the at least one cable grounding layer may include a plurality of cable grounding layers, each cable grounding layer in the plurality of cable grounding layers being separated from each other cable grounding layer in the plurality of cable grounding layers.

In a second implementation of such a wireline RF communications system, the printed circuit board may further include at least one additional component grounding layer. Each respective one of the at least one additional component grounding layer may be coextensive with the substrate and may be tightly wirelessly coupled to a respective one of the at least one cable grounding layer.

In an instance of that second implementation, the at least one cable grounding layer may include a plurality of cable grounding layers, and at least one of the at least one additional component grounding layer may be disposed between two cable grounding layers.

A third implementation of such a wireline RF communications system may further include an infinite ground plane wirelessly coupled to the at least one cable grounding layer.

In a first instance of that third implementation, the at least one cable grounding layer may face the infinite ground plane. In a second instance of that third implementation, the at least one cable grounding layer may face away from the infinite ground plane.

In a fourth instance of that third implementation the wireline RF communications system may be an automotive network, and the infinite ground plane may a vehicle structural component coupled to a vehicle chassis or battery ground.

In a fourth implementation of such a wireline RF communications system, the at least one node may further include a grounding enclosure surrounding at least one node, and the grounding enclosure may be conductively coupled to the shielding.

A method according to implementations of the subject matter of this disclosure for diverting to ground a noise current, in shielding of a cable in a wireline radiofrequency (RF) communications system having a plurality of nodes, includes conductively coupling the shielding to a cable grounding layer of a printed circuit board in a node in the plurality of nodes, the node including (i) at least one functional circuit component, and (ii) a printed circuit board having a substrate defining a major plane, wherein the at least one functional circuit component is mounted on a first side of the major plane of the substrate, the printed circuit board further including (a) a cable connector mounted on a second side of the major plane of the substrate, opposite the first side, and (b) at least one component grounding layer parallel to the major plane and coupled to the at least one functional component, wherein the cable grounding layer is parallel to the major plane and separated from the at least one component grounding layer, and is coextensive with the substrate without coupling to any other component.

A first implementation of such a method may further include coupling the shielding to at least one additional cable grounding layer that is coextensive with the substrate, while maintaining separation of the cable grounding layer from each of the at least one additional component grounding layer.

An instance of that first implementation may further include tightly wirelessly coupling at least one additional component grounding layer, that is coextensive with the substrate, to a respective one of the cable grounding layer and one of the at least one additional cable grounding layer.

A second implementation of such a method may further include tightly wirelessly coupling an additional component grounding layer, that is coextensive with the substrate, to the cable grounding layer.

In a third implementation of such a method, coupling the shielding to a cable grounding layer may include coupling the shielding to a cable grounding layer that is tightly wirelessly coupled to a component grounding layer.

A fourth implementation of such a method may further include wirelessly coupling the cable grounding layer to an infinite ground plane.

A first instance of such a fourth implementation may further include orienting the cable grounding layer to face the infinite ground plane. A second instance of such a fourth implementation may further include orienting the cable grounding layer to face away from the infinite ground plane.

In a third instance of such a fourth implementation, when the wireline RF communications system is an automotive network, wirelessly coupling the cable grounding layer to an infinite ground plane may include wirelessly coupling the cable grounding layer to a vehicle structural component.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 1 shows a portion of a wireline communication system incorporating implementations of the subject matter of this disclosure;

FIG. 2 is a close up view of a portion of FIG. 1;

FIG. 6 is a cross-sectional view of a fourth implementation of the subject matter of this disclosure;

FIG. 7 is a cross-sectional view of a fifth implementation of the subject matter of this disclosure;

DETAILED DESCRIPTION

Figure 3:
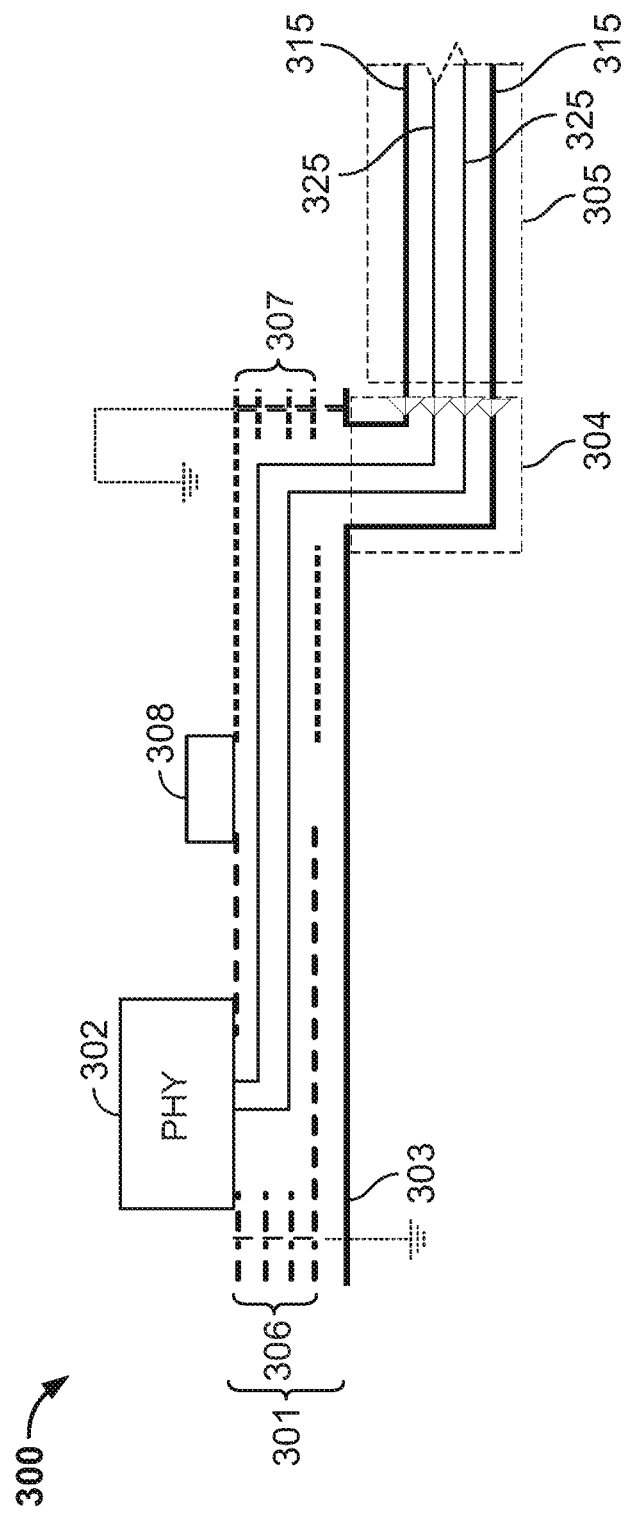
FIG. 3 is a cross-sectional view of a first implementation of the subject matter of this disclosure.
Figure 5:
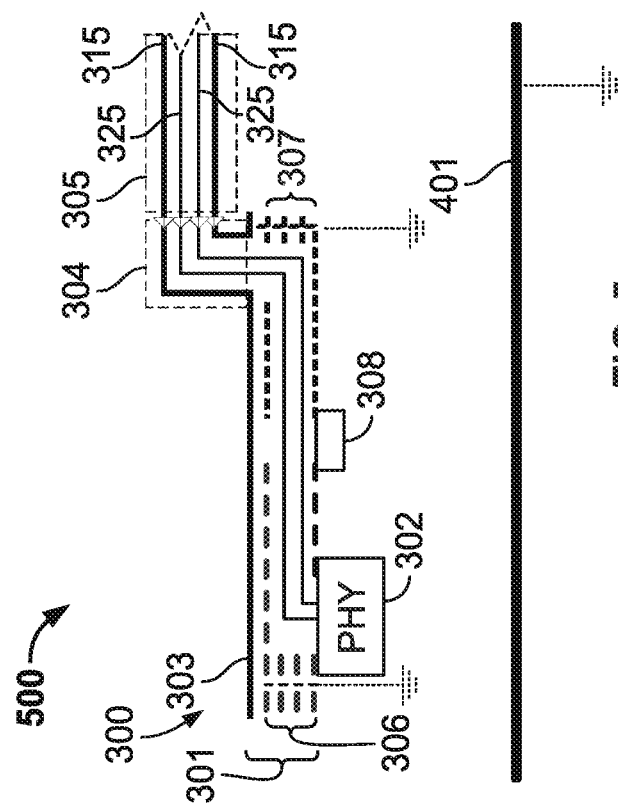
FIG. 5 is a cross-sectional view of a third implementation of the subject matter of this disclosure.

As noted above, wireline connections for some high-speed interfaces, particularly, e.g., for networking applications, operate under various standards that include strict electromagnetic compatibility requirements incorporating cable shielding specifications. Those applications may include automotive Ethernet under the IEEE 802.3ch and 802.3cy standards, as well as the A-PHY long-reach SerDes standard of the MIPI Alliance, Inc., and standards set by the NAV Alliance and the Automotive SerDes Alliance (ASA). However, the subject matter of this disclosure also may be relevant to any other kind of high-speed signaling over frequencies in the RF range.

While direct current signals can induce interference, this disclosure is concerned primarily with interference (e.g., in a data signal) resulting from or caused by alternating current or RF signals. While the foregoing standards and other relevant standards require cables to be shielded and cable connectors to be grounded, in many situations, it may be difficult to divert RF noise currents, that are induced in cable shielding, through connectors to ground.

In a typical scenario, functional circuitry may be mounted on a printed circuit board along with a cable connector. For example, in a networking scenario, the functional circuitry may include an Ethernet physical layer transceiver (PHY), as well as other components, while the cable connector is a grounded coaxial connector or a grounded connector for a shielded twisted pair (STP) or shielded parallel pair (SPP) cable.

As is well known, a printed circuit board (PCB) may have a dielectric substrate layer with a metallic surface layer in which a pattern of conductive traces is formed to interconnect the PHY with other components as well as with conductors in the cable connector. More complex PCBs may have multiple patterned metallic layers, separated by additional dielectric layers, providing more complex signal routing by allowing traces to cross without intersecting (e.g., using through-hole vias to allow signals to jump from one layer to another).

In such multi-layer PCBs, one or more of the extra metallic layers may be used for ground planes. Typically, a first set of one or more ground planes is provided for the functional components, and a separate set of one or more ground planes is provided for the cable connectors. While a "digital" or "signal" or "component" ground may be formed in a separate metallic layer from a "cable" ground, it also is known to form a signal ground and a cable ground in the same metallic layer. If a signal ground and a cable ground are formed in the same metallic layer, that metallic layer typically is segmented so that the two ground planes are electrically separate. Even in cases where multiple signal ground planes and multiple cable ground planes are provided, typically each metallic layer is segmented for use as both a signal ground plane and a cable ground plane, which are electrically separate. Thus, typically, neither a signal ground plane nor a cable ground plane is a continuous layer coextensive with the PCB.

Although in some conventional implementations the signal ground planes and cable ground planes are separate in the direct-current (DC) domain, those respective signal ground planes and cable ground planes may be coupled in the alternating-current (AC) or RF domain by one or more coupling capacitors. But despite the AC coupling, in conventional implementations gaps remain that impede the dispersion of strong RF interference currents that flow into the cable ground plane after being induced in cable shielding by RF signals in the ambient environment or RF signals from functional components on the PCB. Moreover, these typical ground planes may have component connections that further impede the dispersion of strong RF interference currents, and moreover may carry micro-signal currents induced by the functional components.

Such PCB assemblies may be nodes in a networked system, such as an automotive network, which is a high-speed networking environment that is particularly sensitive to interference because of the need for real-time, low-latency, highly reliable response to vehicle control signals. However, such assemblies may be used in any wireline networking or communications environment. In such environments, even though shielded cables interconnect the PCB assemblies, interference may induce significant RF currents in the cable shielding which are conducted to the PCB ground planes and must be dispersed to "true" ground (e.g., chassis ground or battery ground in an automotive environment).

In accordance with implementations of the subject matter of this disclosure, a printed circuit board includes, in addition to any conventional signal ground plane or planes and any cable ground plane or planes, at least one additional "solid" ground plane or layer. A "solid" ground plane is a ground plane that is coextensive with the printed circuit board, and is neither segmented nor interrupted by component connections. At least one solid ground plane in accordance with implementations of the subject matter of this disclosure is disposed on a side of a major plane of the substrate of the printed circuit board that is opposite the side having functional circuit elements. A connector, for coupling to a shielded RF communications cable, is mounted on the same side of the substrate of the printed circuit board as the solid cable ground plane. The solid cable ground plane is configured for coupling, through the connector, to shielding of the shielded RF communications cable. More than one additional solid cable ground plane may be provided. Having one or more solid cable ground planes provides improved diversion or dispersion of RF interference currents that may be induced in the shielding of the shielded cable as compared to a typical cable ground plane that is less than fully coextensive with the printed circuit board substrate and that may be interrupted by connections to the ground side of functional components and in which induced micro-signal currents may flow.

Further improvement may be realized by providing not only one or more solid cable ground planes, but also one or more solid signal ground planes. Each solid signal ground plane should be tightly coupled to one of the solid cable ground planes. For a PCB of standard thickness, with copper layers of thicknesses between 0.7 mil (~17.8 µm) and 2.0 mil (~50.8 µm), a separation distance of under about 10 mil (~254 µm) between a solid signal ground plane and a solid cable ground plane is considered tightly coupled. The provision of such solid signal ground planes (which primarily ground functional components), interleaved and tightly coupled with the solid cable ground planes (which disperse interference currents from cable shielding to ground), improves not only grounding of the functional components, but also cable grounding, because of coupling, at edges of the PCB, of the RF noise currents in the solid cable ground plane to the solid signal ground plane.

A PCB as described above in accordance with the subject matter of this disclosure may be used as part of a wireline RF communications system. Examples of a wireline RF communications system include, but are not limited to, Ethernet systems, and particularly automotive Ethernet systems. When used in such a system, a PCB according to implementations of the subject matter of this disclosure experiences even better diversion or dispersion of RF noise currents when the PCB is located close to a ground plane that is large enough to be modeled as an infinite ground plane. In a terrestrial non-mobile system, the Earth itself is the ultimate infinite ground, but any well-grounded substantial metallic structure may be modeled as an infinite ground plane. In an automotive Ethernet system, infinite ground may be provided by a vehicle structural component such as a body or chassis structural member.

The beneficial effect of the infinite ground plane is most pronounced when the solid cable ground plane is oriented to face the infinite ground plane, but substantial beneficial effect is provided even if the solid cable ground plane is oriented to face away from the infinite ground plane, or if the PCB is oriented perpendicular to, but still near, the infinite ground plane. By "near" is meant that the PCB is close enough to the infinite ground plane for wireless coupling between the infinite ground plane and the solid cable ground plane to occur.

The subject matter of this disclosure may be better understood by reference to FIGS. 1-10.

FIG. 1 shows a portion 100 of a wireline communication system including a pair of printed circuit boards (PCBs) 101 interconnected by a shielded cable 102. In accordance with implementations of the subject matter of this disclosure, each printed circuit board 101 (shown in more detail in FIG. 2) includes a shielded connector 201 that couples the shielding of cable 102 to one or more grounded layers of PCB 101, separate from the layers used to ground functional components that are mounted on PCB 101.

The uppermost (as drawn in FIGS. 1 and 2) layer 202 of each PCB 101 is the aforementioned solid cable ground plane which, as best seen in FIG. 2, is coextensive with PCB 101 and is uninterrupted over the expanse of PCB 101, except where shielded cable connector 201 is attached. The next lower metal layer, (as drawn in FIGS. 1 and 2 and visualized by phantom lines) is disposed beneath the uppermost solid cable ground plane 202. The lower metal layer is divided by trench 205 that interrupts the continuity of the lower metal layer. Consequently, the lower metal layer is divided into a cable ground plane 212, and a signal ground plane 203, each of which occupies only a portion of the of the lower metal layer—in other words, less than the entire expanse of PCB 101. Thus, while the uppermost solid cable ground plane 202 occupies the entire upper layer of PCB 101, the lower cable ground plane 212 occupies only the area immediately surrounding cable connector 201, and is coplanar with, but separated from, signal ground plane 203 that, in the implementation depicted in FIGS. 1 and 2, occupies the remaining portions of the lower metal layer. Functional components (not shown) may be mounted on the lowermost (as drawn in FIGS. 1 and 2) layer 222 of PCB 101.

Implementations of the type shown in FIGS. 1 and 2 embody the option, described above, of positioning the PCBs 101 (and cable 102) close enough to an infinite ground plane 204 for the solid cable ground plane 202 to couple to the infinite ground plane. These particular implementations embody a variant in which the solid cable ground plane 202 faces away from infinite ground plane 204 which, in an automotive implementation, may be a vehicle structural component connected to battery ground or chassis ground, and, in a fixed terrestrial implementation may be a metallic "bench" or other conductive structure connected to a true earthed ground.

Various sample configurations of the various conductive layers according to implementations of the subject matter of this disclosure are illustrated schematically in cross-section in FIGS. 3-9, in which the thicknesses of the conductive layers, and the dielectric layers between them (which are implied by empty space but, to maintain drawing clarity, are not explicitly shown) are not drawn to scale. In these drawings, solid cable ground planes that are coextensive with PCB 101 (as well as cable shielding) are shown by thick solid lines, conventional cable ground planes are shown by finely dashed lines, and signal ground planes are shown by coarsely dashed lines. Where multiple parallel ground planes are coupled together, that coupling is illustrated by a line perpendicular to those planes. The perpendicular line is dashed, or not dashed, in the same way as the planes that it connects.

In the cross-sectional view of FIG. 3, looking edge-on at the major plane of printed circuit board substrate 301, a functional circuit component 302, drawn as a physical layer transceiver (PHY), is located on the surface shown as the uppermost layer in the orientation of the drawing, in conductive relationship with a signal ground plane 306. Solid cable ground plane 303 is located on the surface shown as the lowermost layer. Although connector 304 is coupled to conventional cable grounding planes 307, connector 304 also is mounted in conductive relationship with solid cable ground plane 303 and provides a connection for cable 305, which includes a plurality (two shown) of signal conductors 325, surrounded by conductive shielding 315. The conductive relationship among solid cable ground plane 303, connector 304 and cable 305 allows for any RF currents induced in cable shielding 315 by interfering RF signals to be conducted or diverted to ground plane 303 through connector 304 and dispersed to ground.

Signal conductors 325 (see also FIG. 2), which may be multiple single-ended conductors or the members of a differential conductive pair, are coupled to functional circuit component 302 (e.g., a PHY), which is mounted in a grounding conductive relationship on one of signal grounding planes 306. While signal grounding planes 306 and cable grounding planes 307 are physically separated, and electrically separated in the DC domain, signal grounding planes 306 and cable grounding planes 307 may be coupled in the AC/RF domain by coupling capacitor 308, which is shown in conductive relationship with both (a) one of signal grounding planes 306 and (b) one of cable grounding planes 307.

Figure 4:
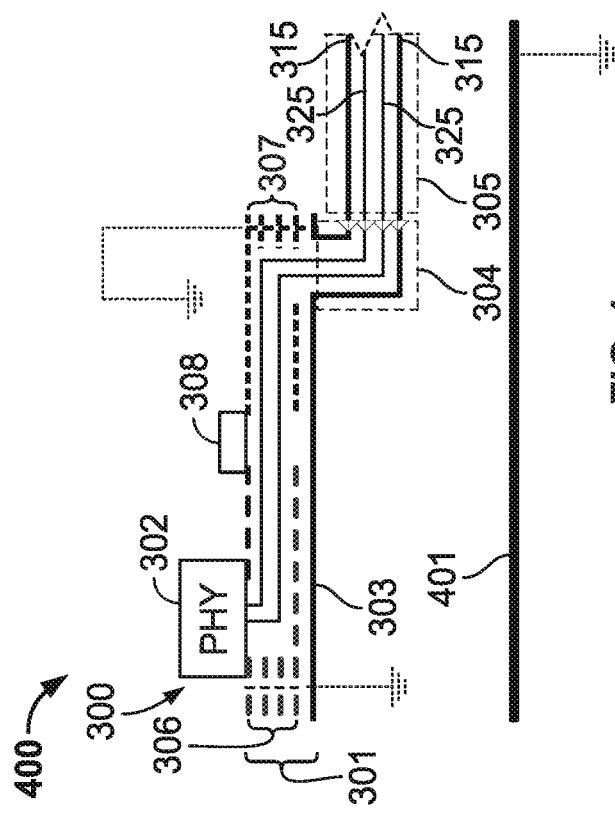
FIG. 4 is a cross-sectional view of a second implementation of the subject matter of this disclosure.

Configuration 400 shown in FIG. 4 is substantially identical to configuration 300, except that PCB 300 is shown adjacent to infinite ground plane 401. As noted above, in an automotive implementation, infinite ground plane 401 may be a vehicle structural component, such as the vehicle chassis. In this configuration, solid cable ground plane 303, connector 304 and cable 305 face infinite ground plane 401. Cable ground plane 303 is positioned at a distance that allows RF currents to couple to infinite ground plane 401, so as to aid in dispersing the RF currents to ground. A typical distance between solid cable ground plane 303 and infinite ground plane 401 is between 0.5 cm and 10 cm. In most electromagnetic compatibility (EMC) test standards for automotive systems, as well as other industry standards including military standards (e.g., MIL STD 461), the distance is 5 cm.

In configuration 500 shown in FIG. 5, PCB 300 is again shown adjacent infinite ground plane 401 as in FIG. 4, but with the solid cable ground plane 303 facing away from infinite ground plane 401, as in FIG. 2. Although configuration 500 may not function as well as configuration 400 in dispersing RF interference currents to ground, configuration 500 still functions better than a configuration with no infinite ground plane, and may be necessitated in some practical implementations based on form factor constraints.

Configuration 600 of FIG. 6 is similar to configuration 300 of FIG. 3, and corresponding components are numbered identically to components of configuration 300. However, configuration 600 has two solid cable ground planes 303, each of which is coextensive with PCB 101, rather than just a single solid cable ground plane as in configuration 300. Adding an additional solid cable ground plane 303 can further improve the dispersion of RF interference currents to ground through the wireless coupling of those RF interference currents from one solid cable ground plane to an adjacent solid cable ground plane at edges of the PCB, providing additional pathways to ground for the RF interference currents.

Further improvement is observed when adding a third solid cable ground plane 303 as in configuration 700 of FIG. 7. As in the case of configuration 600, configuration 700 share many structural features with configuration 300 and as in FIG. 6 corresponding components are numbered identically to components of configuration 300. However, configuration 700 has three solid cable ground planes 303 that are coextensive with PCB 101, providing even more additional pathways to ground for the RF interference currents than the two solid cable ground planes 303 of configuration 600.

Figure 8:
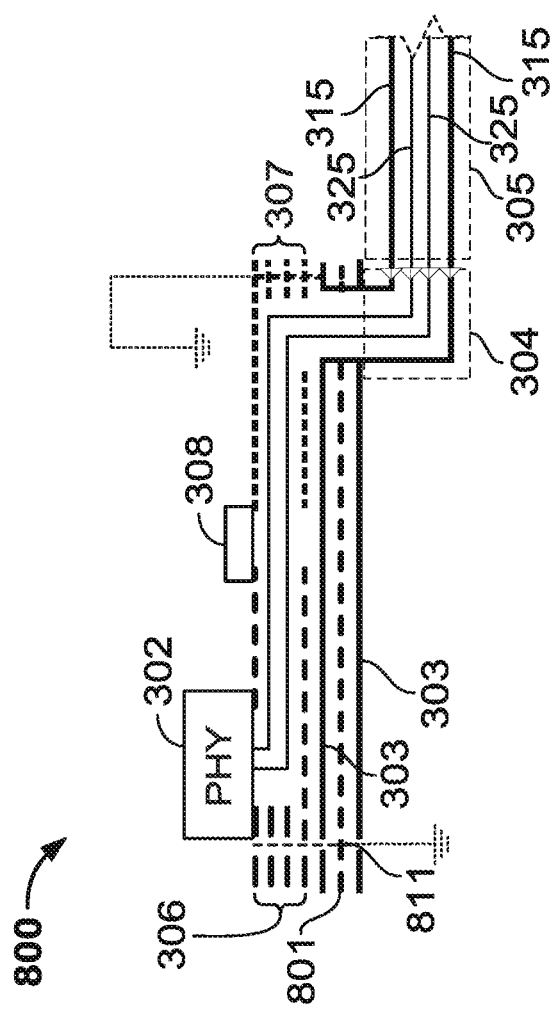
FIG. 8 is a cross-sectional view of a sixth implementation of the subject matter of this disclosure.

Like configurations 400, 500, 600 and 700, configuration 800 of FIG. 8 shares many features in common with configuration 300 (and again corresponding components are numbered identically to components of configuration 300). However, configuration 800 also has a solid signal ground plane 801 in addition to two solid cable ground planes 303. Although indicated by a dashed line to indicate that it is a signal ground plane like signal ground planes 306 and not a cable ground plane, solid signal ground plane 801 differs from signal ground planes 306 in that, like solid cable ground planes 303, solid signal ground plane 801 is a "solid" ground plane, coextensive with PCB 301 and not interrupted by any component or other connections, except where it is connected to ground at 811. In particular, solid signal ground plane 801 is interleaved with—i.e., positioned in between— the two solid cable ground planes 303. While the addition of solid signal ground plane 801 improves the grounding of functional circuit components 302, the addition of solid signal ground plane 801 also improves the dispersion of RF interference currents from the cable shielding 315, resulting from edge coupling similar to that described above in connection with FIGS. 6 and 7, but in this case there is edge coupling between solid cable ground planes 303 and solid signal ground plane 801.

The presence of solid signal ground plane 801 most effectively improves the dispersion of RF interference currents from the cable shielding 315 when solid signal ground plane 801 is tightly coupled to an adjacent solid cable ground plane 303. As described above, for PCBs of conventional dimensions, "tightly coupled" means having a separation of at most about 10 mil (~254 µm), and preferably between about 4 mil (~101.6 μm) and about 8 mil (~202.3 μm), to allow wireless coupling to occur. Indeed, although two solid cable ground planes 303 are shown in configuration 800, adding a single solid signal ground plane 801 tightly coupled to a single solid cable ground plane 303 improves dispersion of RF interference currents from the cable shielding 315 better than the provision of additional solid cable ground planes 303. Multiple tightly-coupled pairs of solid cable ground planes 303 and solid signal ground planes 801 perform even better.

Figure 9:
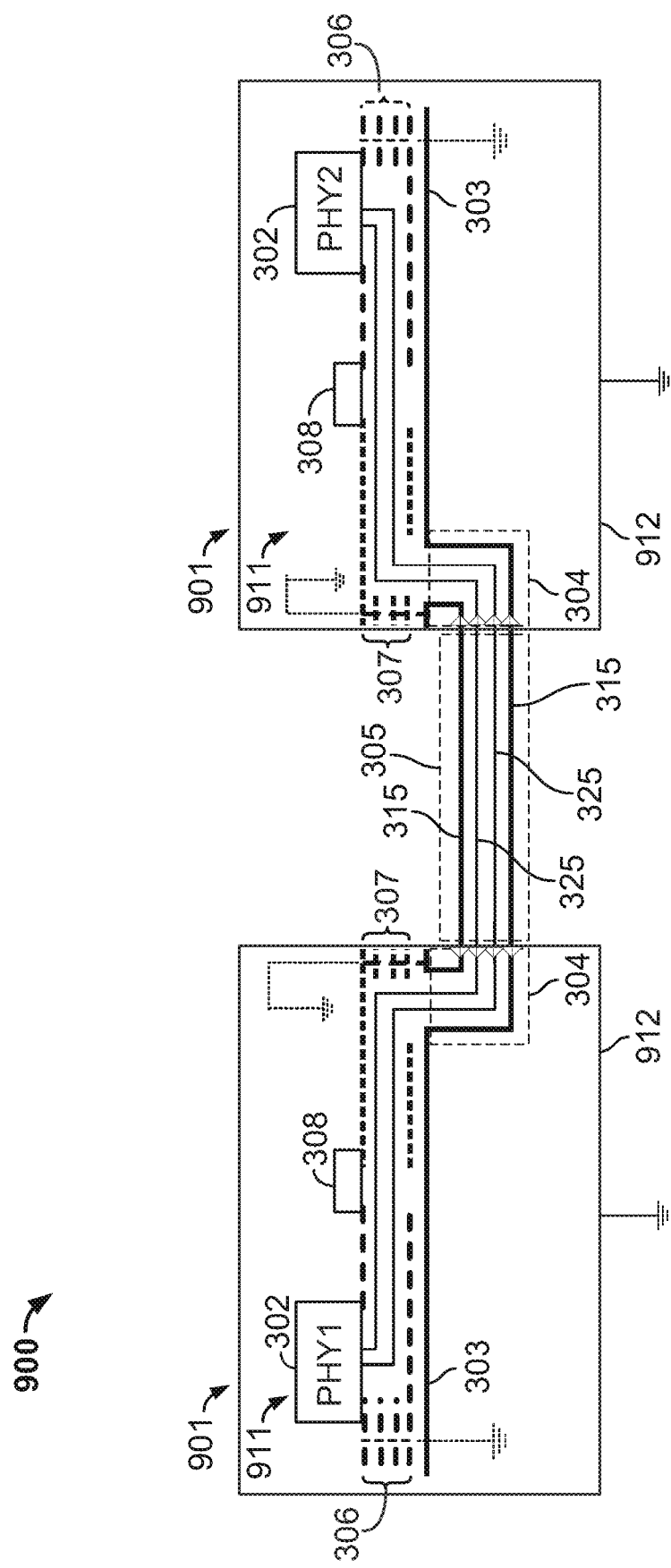
FIG. 9 is a cross-sectional view of a seventh implementation of the subject matter of this disclosure.

FIG. 9 shows the ground plane configuration 900 for a system according to implementations of the subject matter of this disclosure such as that shown in FIG. 1. Configuration 900 includes two separate nodes 901, each having a PCB 911 configured in accordance with implementations of the subject matter of this disclosure, interconnected by cable 305. Although in the implementation 900 shown in FIG. 9, each PCB 911 is depicted as being similar to configuration 300, any of the foregoing configurations may be used in any individual node of a system according to implementations of the subject matter of this disclosure, and the two PCBs 911 may differ in configuration from each other. In addition, each node 901 is shown as being surrounded by a grounded conductive enclosure 912 (for instance, suitably, a "Faraday cage"), which may be conductively coupled to cable connector 304, and thereby to cable shielding 315, where connector 304 passes through enclosure 912. However, the inclusion of such an enclosure in any node of a system according to implementations of the subject matter of this disclosure is optional, and may be based on the circumstances of each particular implementation.

Figure 10:
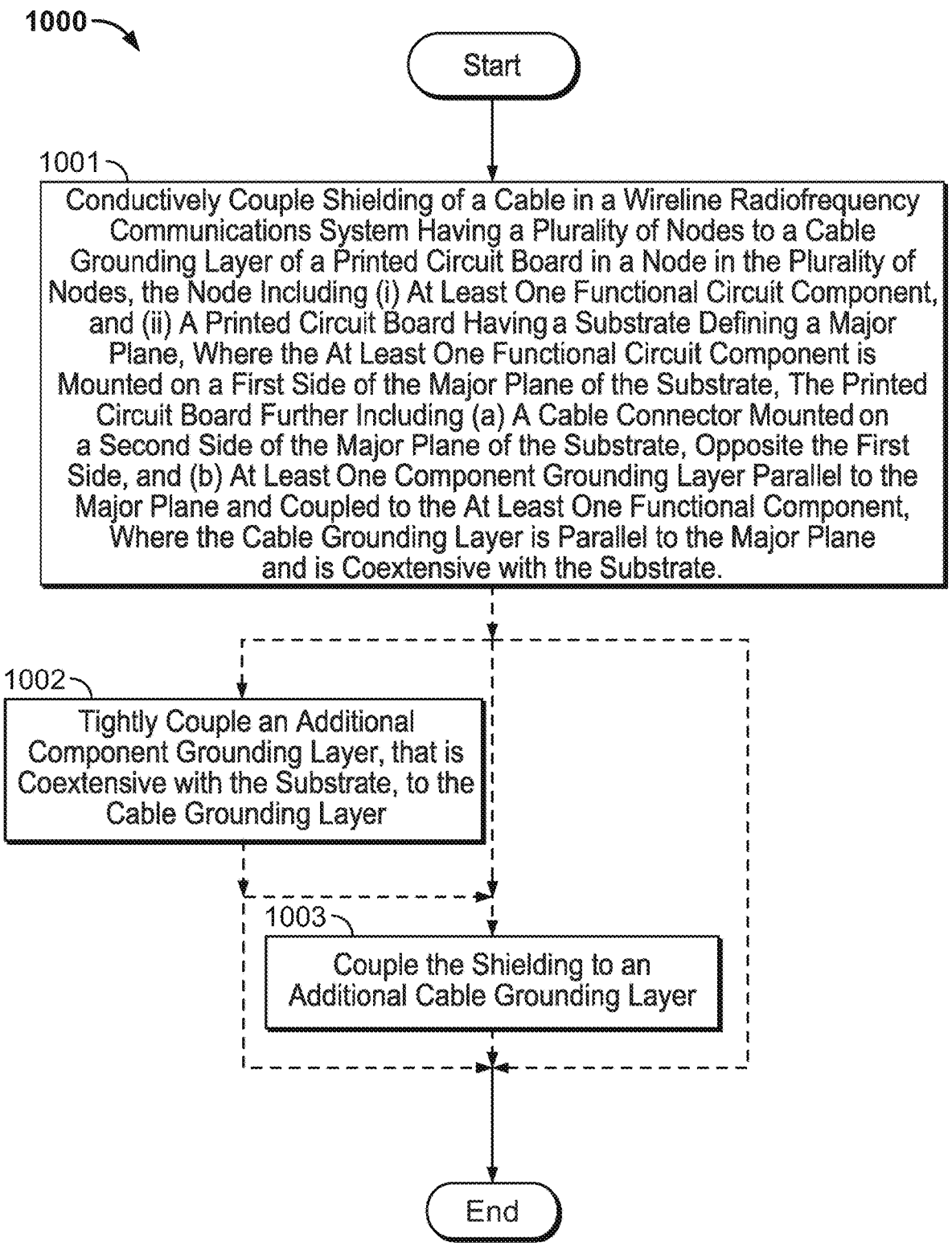
FIG. 10 is a flow diagram illustrating a method according to implementations of the subject matter of this disclosure.

A method according to implementations of the subject matter of this disclosure is diagrammed in FIG. 10.

Method 1000 begins at 1001 where shielding of a cable, in a wireline RF communications system having a plurality of nodes, is conductively coupled to a cable grounding layer of a printed circuit board in a node in the plurality of nodes, the node including (i) at least one functional circuit component, and (ii) a printed circuit board having a substrate defining a major plane, where the at least one functional circuit component is mounted on a first side of the major plane of the substrate, the printed circuit board further including (a) a cable connector mounted on a second side of the major plane of the substrate, opposite the first side, and (b) at least one component grounding layer parallel to the major plane and coupled to the at least one functional component, where the cable grounding layer is parallel to the major plane and is coextensive with the substrate. Method 1000 may end here.

However, optionally, at 1002, an additional component grounding layer, that is coextensive with the substrate, is tightly coupled to the cable grounding layer. Next, optionally, at 1003, whether or not the option to tightly couple the additional component grounding layer to the cable grounding layer was exercised at 1002, the shielding is coupled to an additional cable grounding layer, and method 1000 ends or, optionally, method 1000 ends after 1002.

Thus structures have been described for mitigating RF noise by improved grounding of the shielding of a shielded network cable coupled to a printed circuit board.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A printed circuit board comprising:
    a substrate defining a major plane;
    a first side of the major plane of the substrate configured for mounting thereon of functional circuit elements;
    a cable connector mounted on a second side of the major plane of the substrate, opposite the first side, for coupling to a shielded radiofrequency (RF) communications cable;
    at least one component grounding layer parallel to the major plane configured for coupling to the functional elements; and
    at least one cable grounding layer parallel to the major plane and separated from the at least one component grounding layer, each cable grounding layer in the at least one cable grounding layer being coextensive with the full expanse of the substrate and being configured for coupling, through the connector, to shielding of the shielded RF communications cable, without coupling to any other component.

2. The printed circuit board of claim 1 wherein the at least one cable grounding layer comprises a plurality of cable grounding layers, each cable grounding layer in the plurality of cable grounding layers being separated from each other cable grounding layer in the plurality of cable grounding layers.

3. The printed circuit board of claim 1 further comprising:
    at least one additional component grounding layer; wherein:
    each respective one of the at least one additional component grounding layer is coextensive with the full expanse of the substrate and is wirelessly coupled to a respective one of the at least one cable grounding layer.

4. A wireline radiofrequency (RF) communications system, comprising:
    a plurality of nodes, at least one node in the plurality of nodes comprising:
        at least one functional circuit component, and
        a printed circuit board having a substrate defining a major plane, wherein the at least one functional circuit component is mounted on a first side of the major plane of the substrate, the printed circuit board further including:
            a cable connector mounted on a second side of the major plane of the substrate, opposite the first side,
            at least one component grounding layer parallel to the major plane and coupled to the at least one functional component, and
            at least one cable grounding layer parallel to the major plane and separated from the at least one component grounding layer, each cable grounding layer in the at least one cable grounding layer being coextensive with the full expanse of the substrate; and
    a shielded RF cable coupled to the cable connector for coupling the at least one node to another node in the plurality of nodes, and having shielding that is conductively coupled, through the connector, to the at least one cable grounding layer, each cable grounding layer in the at least one cable grounding layer being without coupling to any other component.

5. The wireline RF communications system of claim 4 wherein the at least one cable grounding layer comprises a plurality of cable grounding layers, each cable grounding layer in the plurality of cable grounding layers being separated from each other cable grounding layer in the plurality of cable grounding layers.

6. The wireline RF communications system of claim 4 wherein:
the printed circuit board further comprises at least one additional component grounding layer; and
each respective one of the at least one additional component grounding layer is coextensive with the full expanse of the substrate and is wirelessly coupled to a respective one of the at least one cable grounding layer.

7. The wireline RF communications system of claim 6 wherein:
the at least one cable grounding layer comprises a plurality of cable grounding layers; and
at least one of the at least one additional component grounding layer is disposed between two cable grounding layers.

8. The wireline RF communications system of claim 4 further comprising an infinite ground plane wirelessly coupled to the at least one cable grounding layer.

9. The wireline RF communications system of claim 8 wherein the at least one cable grounding layer faces the infinite ground plane.

10. The wireline RF communications system of claim 8 wherein the at least one cable grounding layer faces away from the infinite ground plane.

11. The wireline RF communications system of claim 8 wherein:
the wireline RF communications system is an automotive network; and
the infinite ground plane is a vehicle structural component coupled to a vehicle chassis or battery ground.

12. The wireline RF communications system of claim 4 wherein:
the at least one node further comprises a grounding enclosure surrounding at least one node; and
the grounding enclosure is conductively coupled to the shielding.

13. A method of diverting to ground a noise current in shielding of a cable in a wireline radiofrequency (RF) communications system having a plurality of nodes, the method comprising:
conductively coupling the shielding to a cable grounding layer of a printed circuit board in a node in the plurality of nodes, the node including (i) at least one functional circuit component, and (ii) a printed circuit board having a substrate defining a major plane, wherein the at least one functional circuit component is mounted on a first side of the major plane of the substrate, the printed circuit board further including (a) a cable connector mounted on a second side of the major plane of the substrate, opposite the first side, and (b) at least one component grounding layer parallel to the major plane and coupled to the at least one functional component, wherein the cable grounding layer is parallel to the major plane and separated from the at least one component grounding layer, and is coextensive with the full expanse of the substrate without coupling to any other component.

14. The method of claim 13 further comprising coupling the shielding to at least one additional cable grounding layer that is coextensive with the full expanse of the substrate, while maintaining separation of the cable grounding layer from each of the at least one additional component grounding layer.

15. The method of claim 14 further comprising wirelessly coupling at least one additional component grounding layer, that is coextensive with the full expanse of the substrate, to a respective one of the cable grounding layer and one of the at least one additional cable grounding layer.

16. The method of claim 13 further comprising wirelessly coupling an additional component grounding layer, that is coextensive with the full expanse of the substrate, to the cable grounding layer.

17. The method of claim 13 wherein coupling the shielding to a cable grounding layer comprises coupling the shielding to a cable grounding layer that is wirelessly coupled to a component grounding layer.

18. The method of claim 13 further comprising wirelessly coupling the cable grounding layer to an infinite ground plane.

19. The method of claim 18 further comprising orienting the cable grounding layer to face the infinite ground plane.

20. The method of claim 18 further comprising orienting the cable grounding layer to face away from the infinite ground plane.

21. The method of claim 18 wherein, when the wireline RF communications system is an automotive network, wirelessly coupling the cable grounding layer to an infinite ground plane comprises wirelessly coupling the cable grounding layer to a vehicle structural component.

* * * * *